US012666525B2

(12) United States Patent
Yu et al.

(10) Patent No.: US 12,666,525 B2
(45) Date of Patent: Jun. 23, 2026

(54) ELECTRONIC DEVICE HAVING FLOATING SUPPORT STRUCTURE

(71) Applicant: Yinwang Intelligent Technologies Co., Ltd., Shenzhen (CN)

(72) Inventors: Dongming Yu, Dongguan (CN); Zhenming Hu, Hangzhou (CN); Peihua Cui, Hangzhou (CN); Lei Xiang, Shenzhen (CN)

(73) Assignee: YINWANG INTELLIGENT TECHNOLOGIES CO., LTD., Shenzhen (CN)

( * ) Notice: Subject to any disclaimer, the term of this patent is extended or adjusted under 35 U.S.C. 154(b) by 298 days.

(21) Appl. No.: 18/324,439

(22) Filed: May 26, 2023

(65) Prior Publication Data

US 2023/0300970 A1 Sep. 21, 2023

Related U.S. Application Data

(63) Continuation of application No. PCT/CN2021/097658, filed on Jun. 1, 2021.

(30) Foreign Application Priority Data

Nov. 27, 2020 (CN) .......................... 202011355048.6

(51) Int. Cl.
*H05K 7/20* (2006.01)
*B60R 16/023* (2006.01)
(Continued)

(52) U.S. Cl.
CPC ......... *H05K 1/0203* (2013.01); *B60R 16/023* (2013.01); *H05K 1/181* (2013.01);
(Continued)

(58) Field of Classification Search
CPC ........ H05K 1/0203; H05K 1/181; H05K 7/12; H05K 7/2039; H05K 2201/06; B60R 16/023
(Continued)

(56) References Cited

U.S. PATENT DOCUMENTS 5,500,556 A 3/1996 Kosugi
5,751,062 A * 5/1998 Daikoku ............. H01L 23/4338
257/713
(Continued)

FOREIGN PATENT DOCUMENTS

CN 101193536 A 6/2008
CN 201438532 U 4/2010
(Continued)

*Primary Examiner* — Anatoly Vortman
(74) *Attorney, Agent, or Firm* — Conley Rose, P.C.

(57) ABSTRACT

An electronic device includes a housing assembly, a circuit board, an electronic component, and a floating support assembly that are assembled together. Installation space is formed in the housing assembly. The circuit board, the electronic component, and the floating support assembly are all accommodated in the installation space. The circuit board is installed in the housing assembly. The electronic component is supported by the circuit board and is in signal communication with the circuit board. The floating support assembly is disposed on the circuit board to support the electronic component or disposed in the housing assembly to support the circuit board, so that the electronic component abuts against the housing assembly under an action of a pre-loading force of the floating support assembly.

20 Claims, 8 Drawing Sheets

(51) Int. Cl.

| | |
|---|---|
| H05K 1/02 | (2006.01) |
| H05K 1/18 | (2026.01) |
| H05K 1/181 | (2026.01) |
| H05K 7/12 | (2006.01) |

(52) U.S. Cl.
CPC ............. H05K 7/12 (2013.01); H05K 7/2039 (2013.01); H05K 2201/06 (2013.01)

(58) Field of Classification Search
USPC ........................................................ 361/720
See application file for complete search history.

(56) References Cited

U.S. PATENT DOCUMENTS

| | | | | |
|---|---|---|---|---|
| 5,801,330 | A | 9/1998 | Gademann et al. | |
| 5,812,376 | A | 9/1998 | Mach et al. | |
| 6,365,964 | B1 | 4/2002 | Koors et al. | |
| 6,842,345 | B2 * | 1/2005 | Barsun | H05K 7/1487 |
| | | | | 361/740 |
| 7,023,699 | B2 * | 4/2006 | Glovatsky | H05K 7/20454 |
| | | | | 361/708 |
| 7,056,144 | B2 * | 6/2006 | Barsun | G06F 1/183 |
| | | | | 439/526 |
| 7,061,126 | B2 * | 6/2006 | Meyer | H05K 3/301 |
| | | | | 257/730 |
| 7,345,891 | B2 * | 3/2008 | Barsun | H05K 3/301 |
| | | | | 361/811 |
| 7,583,504 | B2 * | 9/2009 | Aberg | H01L 23/4338 |
| | | | | 174/16.3 |
| 7,646,595 | B2 * | 1/2010 | Barsun | H05K 3/301 |
| | | | | 361/679.31 |
| 8,373,990 | B2 * | 2/2013 | Jarmany | H05K 7/2049 |
| | | | | 361/752 |
| 9,230,882 | B2 * | 1/2016 | Sunaga | H01L 23/4338 |
| 2001/0055198 | A1 | 12/2001 | Park | |
| 2005/0073817 | A1 * | 4/2005 | Barsun | H05K 3/301 |
| | | | | 361/760 |
| 2008/0186681 | A1 | 8/2008 | Deck et al. | |
| 2008/0266808 | A1 * | 10/2008 | Aberg | H01L 23/4338 |
| | | | | 361/709 |
| 2020/0161211 | A1 | 5/2020 | Yang et al. | |

FOREIGN PATENT DOCUMENTS

| | | |
|---|---|---|
| CN | 205611131 U | 9/2016 |
| CN | 207531242 U | 6/2018 |
| CN | 209710590 U | 11/2019 |
| DE | 102015219851 A1 | 4/2017 |
| JP | 2012160646 A | 8/2012 |

* cited by examiner

MCU/IO communication/
OS running, or the like

L2/ADAS
function

L3/L4/L5
advanced function

| Year | Level | SOC energy efficiency ratio | Performance estimation | Power consumption estimation |
|------|-------|-----------------------------|------------------------|------------------------------|
| 2020 | L3 | 1.2 TOPS/W | 100 TOPS to 200 TOPS | 80 W to 160 W |
| 2025 | L4 | 3 TOPS/W | 400 TOPS to 600 TOPS | 130 W to 200 W |
| 3030 | L5 | 8 TOPS/W | >3000 TOPS | >370 W |

ELECTRONIC DEVICE HAVING FLOATING SUPPORT STRUCTURE

CROSS-REFERENCE TO RELATED APPLICATIONS

This application is a continuation of International Patent Application No. PCT/CN2021/097658 filed on Jun. 1, 2021, which claims priority to Chinese Patent Application No. 202011355048.6 filed on Nov. 27, 2020. The disclosures of the aforementioned applications are hereby incorporated by reference in their entireties.

TECHNICAL FIELD

The present disclosure relates to a support heat dissipation structure of an electronic component in an electronic device, and in particular, to an electronic device having a floating support structure.

BACKGROUND

Computing power of an electronic component in an existing electronic device is increasingly powerful. Therefore, power consumption of the electronic component is increased, and a heat generating capacity is also increased. For example, as shown in FIG. 1A to FIG. 1D, in an intelligent vehicle, as an autonomous driving level continuously increases, power consumption and a heat generating capacity of a chip (an example of the electronic component) configured to implement autonomous driving are continuously increased. As a core of autonomous driving, a vehicle-mounted intelligent computing platform needs to connect to a plurality of types of sensors. Each sensor (such as a camera or a laser radar) generates data of 20 megabytes (M Byte) to 100 M Byte per second. A large amount of data generated by the plurality of sensors needs to be analyzed and processed in real time within dozens of milliseconds. Therefore, a requirement on chip performance of the vehicle-mounted intelligent computing platform is very high. Generally, L2 autonomous driving requires >10 trillion operations per second (TOPS) computing power, L3 autonomous driving requires 100 TOPS to 200 TOPS computing power, L4 autonomous driving requires 400 TOPS to 600 TOPS computing power, and L5 autonomous driving requires >3000 TOPS computing power. As a requirement on the computing power continuously increases, power consumption of the vehicle-mounted intelligent computing platform and a chip thereof is continuously increased. In the future, power consumption of the vehicle-mounted intelligent computing platform that implements the L5 autonomous driving exceeds 370 W, and power consumption of a master chip exceeds 200 W. Therefore, to ensure a stable and normal operation of electronic components such as the master chip of the vehicle-mounted intelligent computing platform, effective heat dissipation of the electronic components needs to be ensured. Therefore, a technical person uses different heat dissipation solutions for such an electronic component.

FIG. 2A shows an electronic device for implementing a heat dissipation solution for an electronic component. As shown in FIG. 2A, the electronic device includes a housing assembly 10, a circuit board 20, and an electronic component 30. The housing assembly 10 includes an upper housing 101 and a bottom housing 102 that are assembled together. Installation space for installing the circuit board 20 and the electronic component 30 is formed by encircling the upper housing 101 and the bottom housing 102, and a plurality of protruding parts 101P that protrude towards the bottom housing 102 and that are located in the installation space are further formed on the upper housing 101. The circuit board (e.g., a printed circuit board) 20 is fastened to the upper housing 101 through the plurality of protruding parts 101P, and the electronic component (e.g., a chip) 30 is fastened to and installed on the circuit board 20 and is located between the circuit board 20 and the upper housing 101. In addition, the electronic device further includes a thermally conductive material layer (e.g., a gel layer) that is disposed between the electronic component 30 and the upper housing 101 and that is configured to conduct heat. In an aspect, the thermally conductive material layer is configured to absorb a dimension chain tolerance of two installation structures, in a height direction T, in which the circuit board 20 is installed in the upper housing 101 and the electronic component 30 is installed on the circuit board 20. In another aspect, the electronic component 30 can transfer heat to the upper housing 101 through the thermally conductive material layer, so that the electronic component 30 can dissipate heat through the upper housing 101. In the electronic device, because a tolerance range of the dimension chain tolerance is usually ±0.35 mm, and a thickness of the thermally conductive material layer is not less than 0.2 mm, a maximum thickness of the thermally conductive material layer reaches about 0.9 mm. Therefore, the thermally conductive material layer has a large thickness and a high thermal resistance, and therefore is not suitable for heat dissipation of the electronic component 30 with high power consumption and high heat density.

FIG. 2B shows an electronic device for implementing another heat dissipation solution for the electronic component. As shown in FIG. 2B, a difference between the electronic device and the electronic device in FIG. 2A lies in that the electronic device further includes a temperature equalization plate 40 (e.g., a vacuum temperature equalization plate). The temperature equalization plate 40 is disposed between the electronic component 30 and the upper housing 101, and silicone grease is filled between the temperature equalization plate 40 and the electronic component 30 to improve a heat conduction capability. The thermally conductive material layer (e.g., a gel layer) is disposed between the temperature equalization plate 40 and the upper housing 101. In this way, compared with that in the heat dissipation solution shown in FIG. 2A, a contact area between the temperature equalization plate 40 and the upper housing 101 is larger (greater than a contact area between the electronic component 30 and the upper housing 101 in FIG. 2A), and both the thermally conductive material layer and the temperature equalization plate 40 have high thermal conductivity. Therefore, compared with the heat dissipation solution shown in FIG. 2A, this solution improves a heat dissipation capability of the electronic component 30. However, the temperature equalization plate 40 is added to an electronic chip, adversely affecting the dimension chain tolerance. Therefore, when the thermally conductive material layer is used in the electronic device to compensate for the dimension chain tolerance, the thickness of the thermally conductive material layer may be further increased, and may reach 1.2 millimeters (mm) at most. In addition, a heat transfer path between the electronic component 30 and the upper housing 101 becomes longer, resulting in a larger thermal resistance between the electronic component 30 and the upper housing 101. Therefore, compared with the heat dissipation solution shown in FIG. 2A, this solution has limited improvement on heat dissipation effect of the electronic component 30 with high power consumption and high heat density.

FIG. 2C shows an electronic device for implementing still another heat dissipation solution for the electronic component. As shown in FIG. 2C, a difference between the electronic device and the electronic device in FIG. 2A lies in that a floating heat sink 50 is installed on the upper housing 101 in the electronic device. The floating heat sink 50 is in contact with the electronic component 30 through an opening of the upper housing 101, and silicone grease is filled between the electronic component 30 and the floating heat sink 50. In this way, a floating feature of the floating heat sink 50 is used to absorb the dimension chain tolerance in the height direction T, and the floating heat sink 50 can effectively dissipate heat for the electronic component 30. Therefore, in this heat dissipation solution, a heat transfer path between the electronic component 30 and the upper housing 101 is shorter, and heat dissipation effect is better, so that this heat dissipation solution can be better applied to heat dissipation of the electronic component 30 that has high power consumption and high heat density and that has a high heat dissipation requirement. However, in this heat dissipation solution, the floating heat sink 50 is disposed outside the housing assembly 10, and the opening needs to be provided on the upper housing 101 to enable the floating heat sink 50 to be in contact with the electronic component 30. Therefore, this heat dissipation solution cannot meet a requirement of a standard such as Ingress Protection 67 (IP67) and has a high risk in shielding and anti-corrosion of the electronic component 30, and costs are high.

SUMMARY

In view of this, an electronic device having a floating support structure is provided. The electronic device can implement a floating support solution for an electronic component, so that the electronic component abuts against a housing assembly, to better implement heat dissipation of the electronic component with high power consumption and high heat density through the housing assembly. In addition, the electronic device can easily meet a requirement of a related standard such as dustproof and anti-corrosion.

According to a first aspect, an embodiment of the present disclosure provides an electronic device having a floating support structure. The electronic device includes: a housing assembly, where installation space is formed in the housing assembly; a circuit board, where the circuit board is accommodated in the installation space and installed in the housing assembly; an electronic component, where the electronic component is accommodated in the installation space and supported by the circuit board, and the electronic component is in signal communication with the circuit board; and a floating support assembly, where the floating support assembly is accommodated in the installation space, and the floating support assembly is disposed on the circuit board to support the electronic component or disposed in the housing assembly to support the circuit board, so that the electronic component abuts against the housing assembly under an action of a pre-loading force of the floating support assembly.

According to a technical solution, the floating support assembly can abut the electronic component against the housing assembly, to implement heat dissipation of the electronic component through the housing assembly. In addition, the floating support assembly can replace a thermally conductive material layer to compensate for a dimension chain tolerance of the electronic device, to avoid affecting heat dissipation of the electronic component due to an excessive thickness of the thermally conductive material layer.

According to the first aspect, in a first possible implementation of the electronic device, the circuit board is fastened to and installed on the housing assembly. The floating support assembly includes: a daughter board, where the electronic component is fastened to and installed on the daughter board, and the daughter board is located between the circuit board and the electronic component; and an elastic support piece, where the elastic support piece is disposed between the daughter board and the circuit board, to apply the pre-loading force to the daughter board from an opposite side of a side that is of the daughter board and on which the electronic component is installed.

According to a technical solution, the daughter board expands a layout range of a chip and improves layout flexibility of the chip. In addition, the elastic support piece is disposed, so that magnitude of the pre-loading force can be flexibly adjusted.

According to the first possible implementation of the first aspect, the floating support assembly further includes a connecting piece, where the connecting piece passes through the daughter board and extends to the circuit board, to enable the daughter board to be connected to the circuit board; and in a state in which the daughter board is connected to the circuit board through the connecting piece, the daughter board and the circuit board can move relative to each other within a predetermined range.

According to a technical solution, the daughter board can appropriately adjust a location relative to the circuit board when the pre-loading force is applied, to ensure that the electronic component always abuts against the housing assembly.

According to the first possible implementation of the first aspect or based on any implementation of the first possible implementation, the elastic support piece is a coil spring, and the coil spring is sleeved on the connecting piece.

According to a technical solution, the elastic floating is implemented in a simpler structure, and installation and fastening between the elastic support piece and the connecting piece are easily implemented.

According to the first possible implementation of the first aspect, or based on any implementation the first possible implementation, the daughter board has a daughter board connection end; and the circuit board has a circuit board connection end corresponding to the daughter board connection end. The daughter board connection end and the circuit board connection end are inserted to each other, so that the signal communication between the electronic component and the circuit board is implemented through the daughter board, the daughter board connection end, and the circuit board connection end.

According to a technical solution, effective signal communication between the electronic component and the circuit board can be ensured.

According to the first possible implementation of the first aspect, or based on any implementation the first possible implementation, the daughter board connection end and the circuit board connection end can move relative to each other with a relative movement between the daughter board and the circuit board.

According to a technical solution, even if the daughter board and the circuit board move relative to each other under floating support of the floating support assembly, the effective signal communication between the electronic component and the circuit board can be ensured.

According to the first aspect, in a second possible implementation of the electronic device, the electronic component is fastened to and installed on the circuit board. The floating support assembly includes a plurality of elastic support pieces, the plurality of elastic support pieces are disposed between an end face of the circuit board and the housing assembly, and the plurality of elastic support pieces are configured to apply the pre-loading force to the end face of the circuit board.

According to a technical solution, the floating support assembly is implemented in a simpler structure and a more flexible manner.

According to the second possible implementation of the first aspect, a plurality of protruding parts facing the installation space are formed on the housing assembly, and the plurality of protruding parts extend towards the circuit board and pass through the circuit board. Each elastic support piece is sleeved on a part that is of the protruding part and that is located on one side of the circuit board, so that the elastic support piece generates the pre-loading force to abut the electronic device disposed on the other side of the circuit board against the housing assembly.

According to a technical solution, the floating support assembly is implemented in a simpler structure.

According to the second possible implementation of the first aspect, or based on any implementation of the second possible implementation, each protruding part includes a main body part and a flange part, the main body part extends through the circuit board from one side of the circuit board, and the flange part is disposed on a part that is of the main body part and that is located on the other side of the circuit board. The elastic support piece is a coil spring, one end of the coil spring abuts against the circuit board, and the other end abuts against the flange part.

According to a technical solution, the floating support assembly is implemented in a simpler structure.

According to the first aspect, in a third possible implementation of the electronic device, the electronic component is fastened to and installed on the circuit board. The floating support assembly includes a plurality of elastic support pieces, the plurality of elastic support pieces are disposed between an outer peripheral part of the circuit board and the housing assembly, and the plurality of elastic support pieces are configured to apply the pre-loading force to the outer peripheral part of the circuit board.

According to a technical solution, the floating support assembly is implemented in a simpler structure and a more flexible manner.

According to the third possible implementation of the first aspect, the elastic support pieces are elastic sheets. The elastic sheets are arranged at intervals around the outer peripheral part of the circuit board, one end of each elastic sheet is connected to the outer peripheral part, and the other end is connected to the housing assembly.

According to a technical solution, the floating support assembly is implemented in a simpler structure.

According to any one of the first aspect or the possible implementations of the first aspect, the housing assembly includes an upper housing and a bottom housing, and the upper housing is fastened to the bottom housing in a detachable manner. The electronic component abuts against the upper housing.

According to a technical solution, layouts of the electronic component and the circuit board can be more flexible.

According to any one of the first aspect or the possible implementations of the first aspect, the upper housing has a top and a side wall part that extends from the top to the bottom housing, and the electronic component abuts against the top.

According to a technical solution, heat dissipation effect of the electronic component through the housing assembly is better, and a force-bearing condition of the electronic component is better.

According to any one of the first aspect or the possible implementations of the first aspect, the electronic device further includes a thermally conductive material layer, where the thermally conductive material layer is disposed between the upper housing and the electronic component.

According to a technical solution, heat dissipation effect of the electronic component through the housing assembly is better.

According to any one of the first aspect or the possible implementations of the first aspect, the circuit board is a board or a coupling board, and the electronic component is a chip.

According to a technical solution, an application scope of the solutions in the present disclosure is wider.

These aspects and other aspects of the present disclosure are more concise and more comprehensive in descriptions of the following (a plurality of) embodiments.

BRIEF DESCRIPTION OF DRAWINGS

The accompanying drawings included in this specification and constituting a part of this specification and this specification jointly show example embodiments, features, and aspects of the present disclosure, and are intended to explain the principles of the present disclosure.

DESCRIPTION OF REFERENCE NUMERALS

10: housing assembly; 101: upper housing; 101P: protruding part; 102: bottom housing; 20: circuit board; 30: electronic component; 40: temperature equalization plate; 50: floating heat sink;

1: housing assembly; 11: upper housing; 111: top; 112: side wall part; 11P: first protruding part; 11P1: main body part; 11P2: flange part; 12: bottom housing; 12P: second protruding part; 2: circuit board; 2c: circuit board connection end; 3: electronic component; 4: floating support assembly; 41: daughter board; 41c: daughter board connection end; 42: connecting piece; 43 or 43': elastic support piece; and T: height direction.

DESCRIPTION OF EMBODIMENTS

The following describes various example embodiments, features, and aspects of the present disclosure in detail with reference to the accompanying drawings. Identical reference signs in the accompanying drawings indicate elements that have same or similar functions. Although various aspects of embodiments are illustrated in the accompanying drawing, the accompanying drawings are not necessarily drawn in proportion unless otherwise specified.

The specific term "example" herein means "used as an example, embodiment or illustration". Any embodiment described as an "example" is not necessarily explained as being superior to or better than other embodiments.

In addition, to better describe the present disclosure, many specific details are provided in the following specific embodiments. A person skilled in the art should understand that the present disclosure can also be implemented without some specific details. In some embodiments, methods, means, and elements that are well-known to a person skilled in the art are not described in detail, so that a main purpose of the present disclosure is highlighted.

In the present disclosure, unless otherwise specified, the "height direction" is a height direction of a housing assembly, and is also consistent with a thickness direction of each of a circuit board and a chip in example embodiments of specific implementations.

The following describes a specific structure of an electronic device having a floating support structure according to a first example embodiment of the present disclosure with reference to the accompanying drawings of this specification.

Figure 1A:
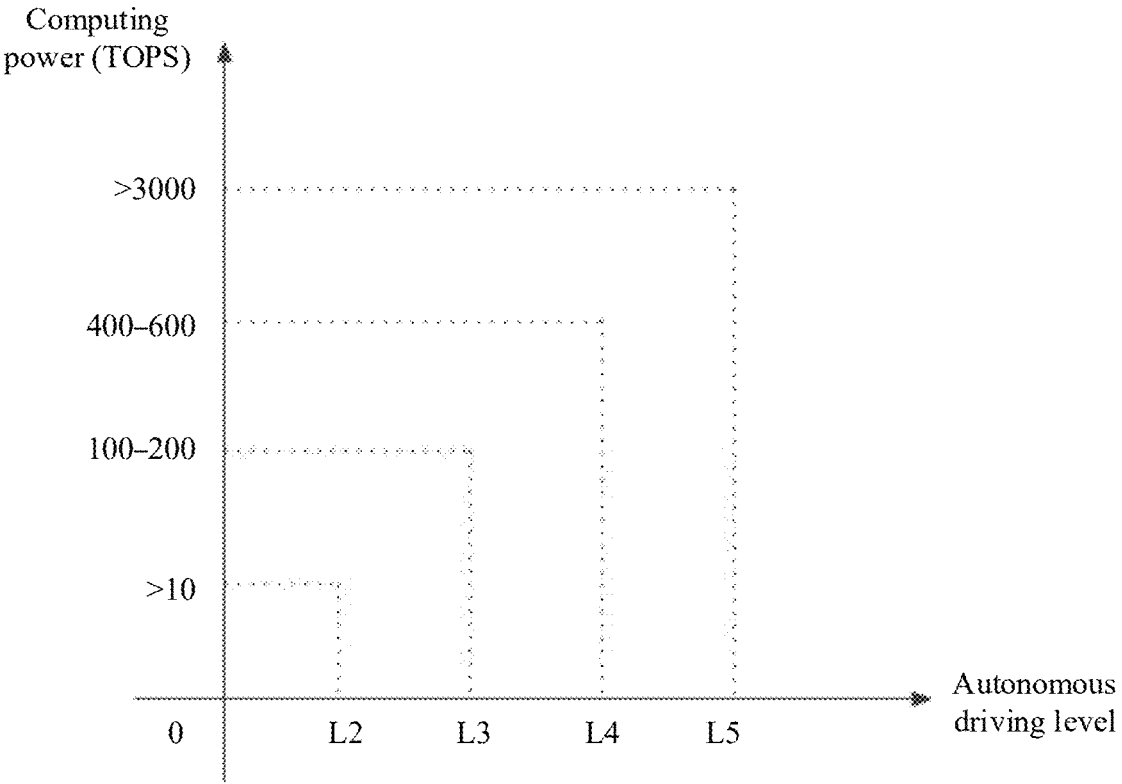
FIG. 1A is a curve diagram depicting a requirement trend of computing power for implementing different levels of autonomous driving of an intelligent vehicle.
Figure 1B:
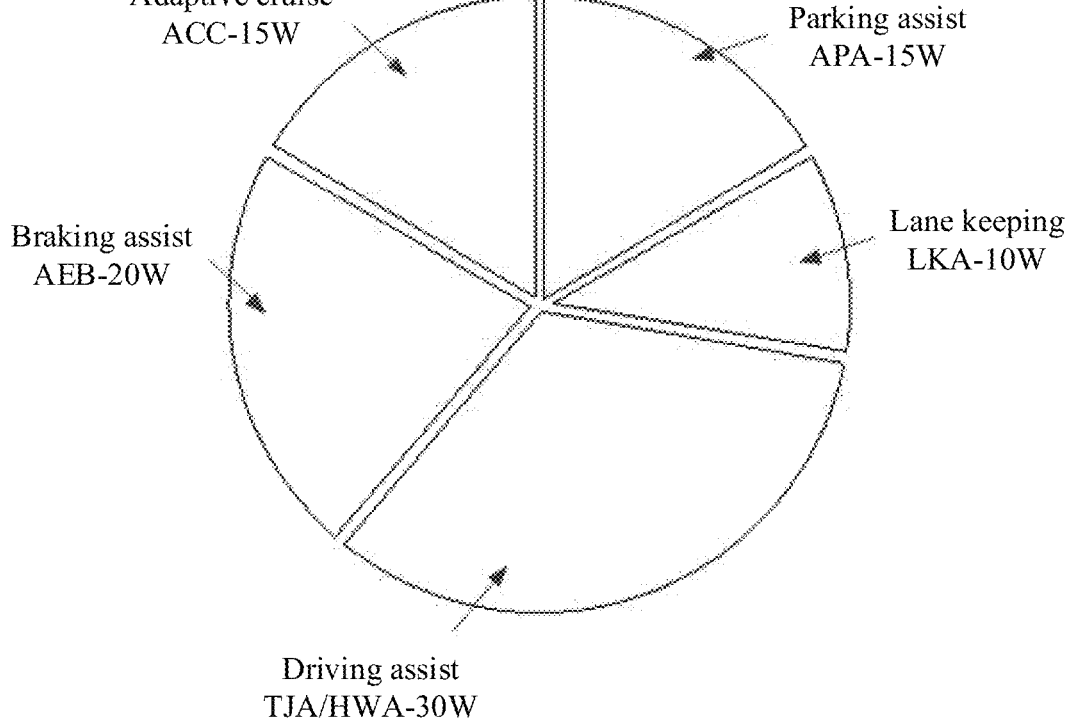
FIG. 1B is a schematic diagram depicting functions and power consumption of an L2/ADAS (advanced driver assistance system)
Figures 1C, 1D:
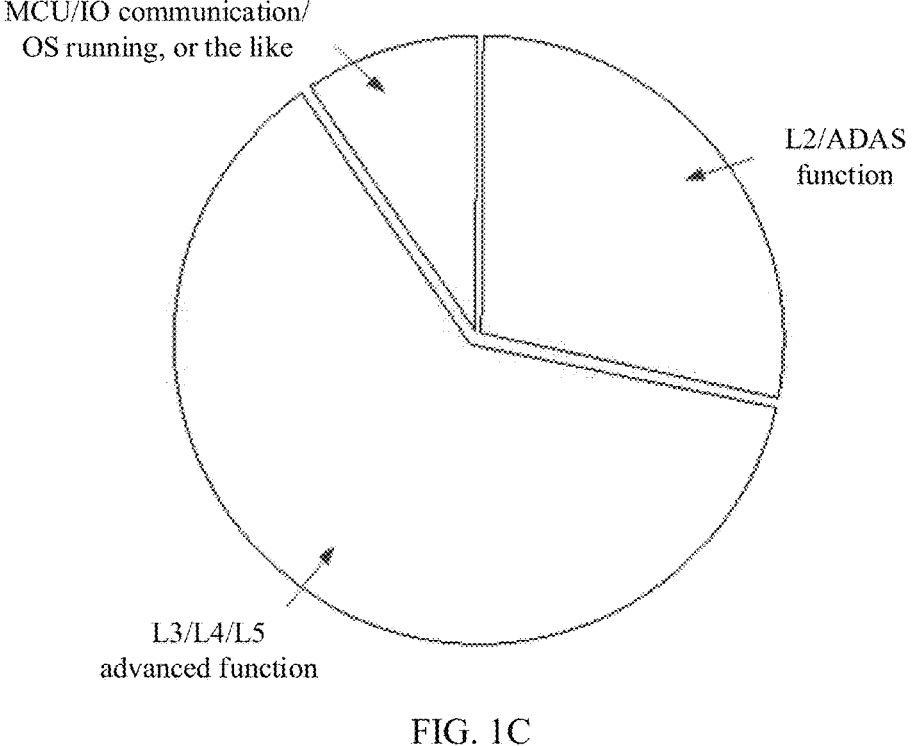
FIG. 1C is a distribution diagram of functions of an autonomous driving domain controller of an intelligent vehicle.
FIG. 1D is a table depicting computing power and power consumption for implementing different levels of autonomous driving of an intelligent vehicle.
Figure 2A:
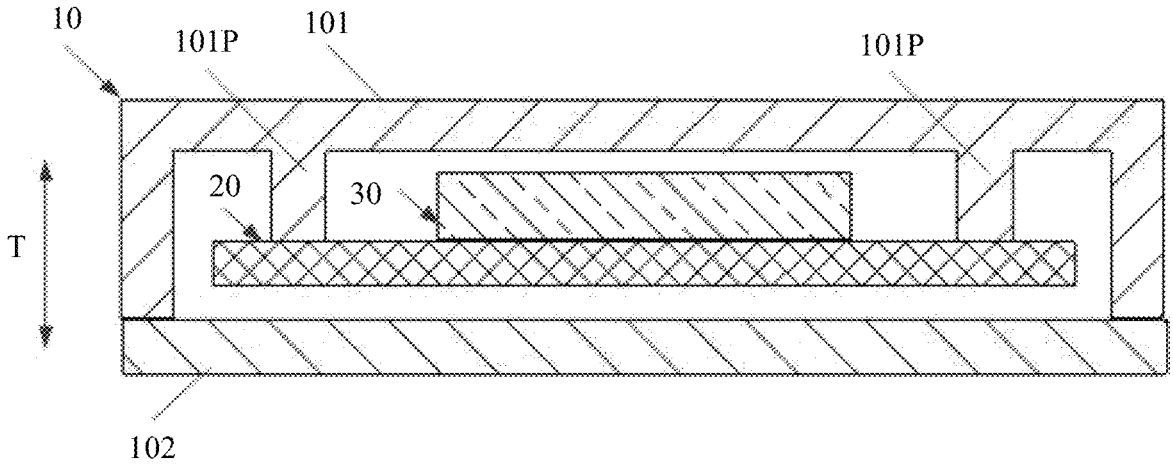
FIG. 2A is a schematic sectional view of an electronic device for implementing a heat dissipation solution for an electronic component.
Figure 2B:
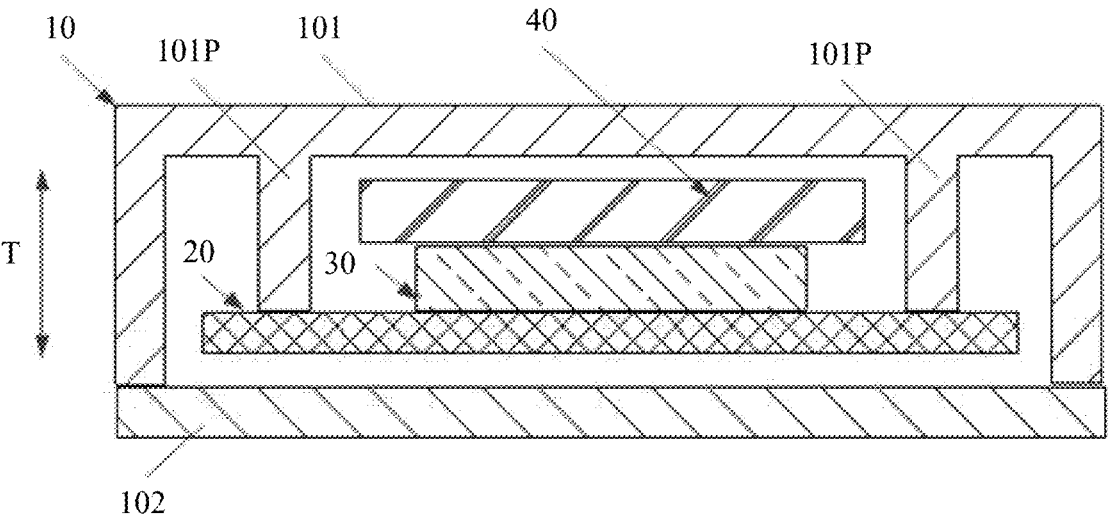
FIG. 2B is a schematic sectional view of an electronic device for implementing another heat dissipation solution for an electronic component.
Figure 2C:
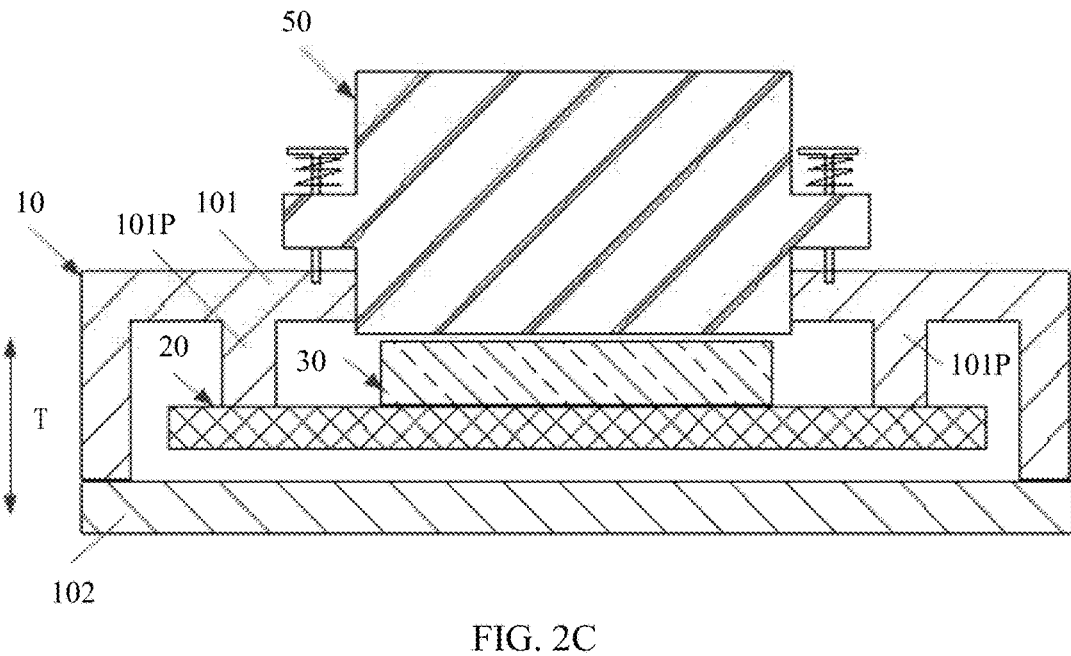
FIG. 2C is a schematic sectional view of an electronic device for implementing still another heat dissipation solution for an electronic component.
Figure 3A:
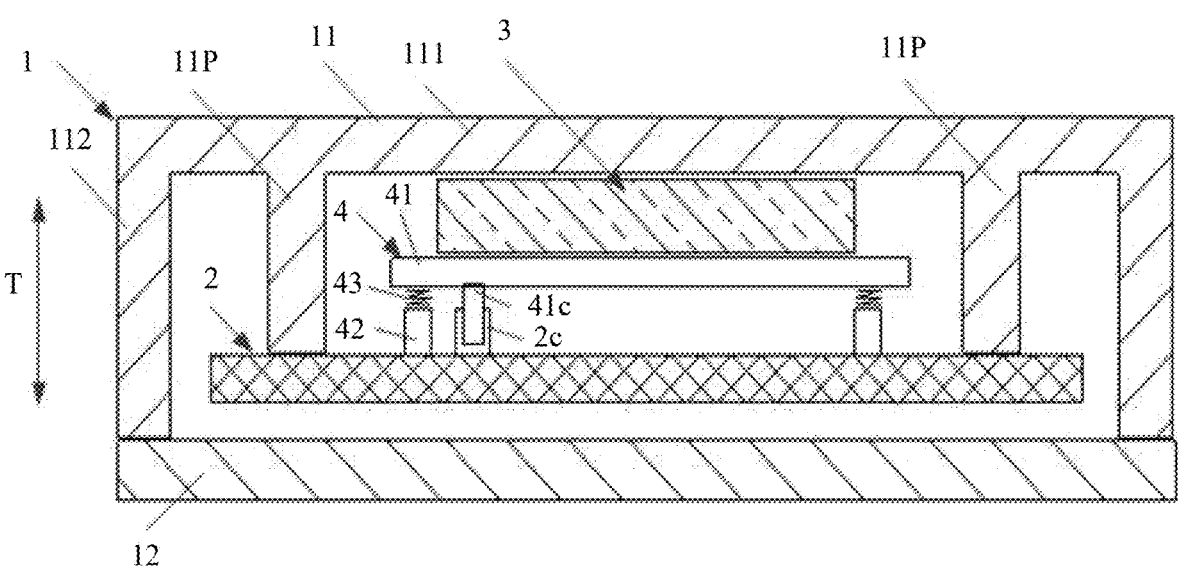
FIG. 3A is a schematic sectional view of an electronic device having a floating support structure according to a first example embodiment of the present disclosure.
Figure 3B:
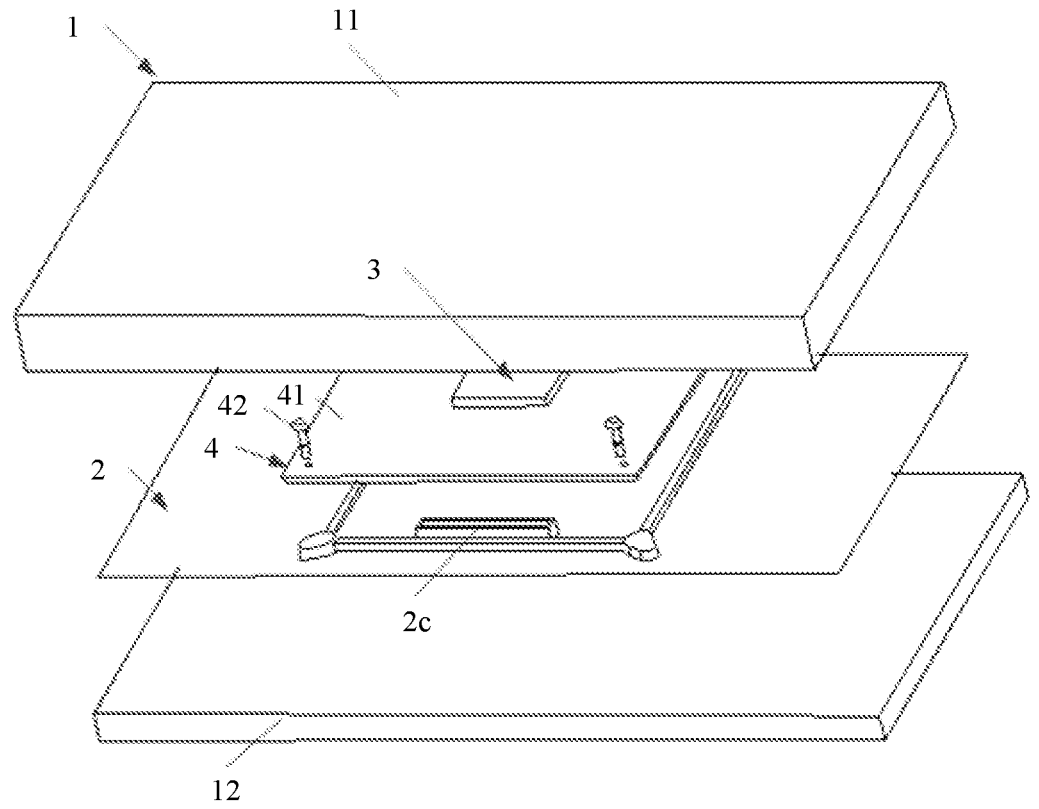
FIG. 3B is a schematic diagram of an exploded structure of the electronic device in FIG. 3A.

As shown in FIG. 3A and FIG. 3B, the electronic device having the floating support structure according to the first example embodiment of the present disclosure includes a housing assembly 1, a circuit board 2, an electronic component 3, and a floating support assembly 4 that are assembled together. Installation space is formed in the housing assembly 1, and the circuit board 2, the electronic component 3, and the floating support assembly 4 are all accommodated in the installation space of the housing assembly 1. The floating support assembly 4 is disposed on the circuit board 2 to be supported by the circuit board 2, and the electronic component 3 is disposed on the floating support assembly 4 to be supported by the floating support assembly 4. Therefore, the floating support assembly 4 is located between the circuit board 2 and the electronic component 3.

Specifically, in this embodiment, the housing assembly 1 includes an upper housing 11 and a bottom housing 12 that are assembled together. The upper housing 11 is fastened to the bottom housing 12 in a detachable manner. The upper housing 11 has a plate-shaped top 111 and a side wall part 112 that extends from a peripheral part of the top 111 towards the bottom housing 12. The bottom housing 12 has a plate-shaped structure, to seal an opening formed by the side wall part 112 of the upper housing 11. Therefore, the installation space of the housing assembly 1 is formed by encircling the top 111, the side wall part 112, and the bottom housing 12 of the upper housing 11.

It should be understood that, although descriptions such as the "upper housing" and the "bottom housing" are used in the present disclosure, a use status or posture of the electronic device in the present disclosure is not limited to the case shown in FIG. 3A, and the electronic device in the present disclosure may be used in various statuses or postures.

In addition, a plurality of first protruding parts 11P protruding towards the bottom housing 12 are formed on the top 111 of the upper housing 11. The first protruding parts 11P do not extend to the bottom housing 12, but sufficient space is reserved between free ends of the first protruding parts 11P and the bottom housing 12. In this way, the circuit board 2 can be installed at the free ends of the first protruding parts 11P, so that the circuit board 2 is fastened to the upper housing 11.

In this embodiment, the entire circuit board 2 has a rectangular flat-plate shape and is a printed circuit board in a board form. The circuit board 2 is accommodated in the installation space and is fastened to the first protruding parts 11P of the upper housing 11 in a manner in which the circuit board 2 is approximately parallel to the top 111 of the upper housing 11, and sufficient space is reserved between the circuit board 2 and the top 111 of the upper housing 11 for disposing the electronic component 3 and the floating support assembly 4.

In addition, the circuit board 2 is further provided with a circuit board connection end 2c that is configured to connect to a daughter board connection end 41c of a daughter board 41 of the floating support assembly 4 in a matched manner. The circuit board connection end 2c protrudes from the circuit board 2 towards an upper part in FIG. 3A and forms a socket part for inserting the daughter board connection end 41c.

In this embodiment, the electronic component 3 is a chip and is fastened to and installed on the daughter board 41 of the floating support assembly 4. Under an action of an elastic support piece 43 of the floating support assembly 4, the electronic component 3 abuts against the top 111 of the upper housing 11 from a lower part in FIG. 3A, so that the electronic component 3 can dissipate heat through the top 111 of the upper housing 11.

In this embodiment, in a height direction T (namely, an up-down direction in FIG. 3A), the floating support assembly 4 is disposed between the electronic component 3 and the circuit board 2, and the electronic component 3 abuts against the top 111 of the upper housing 11 under support of a pre-loading force of the floating support assembly 4. In this embodiment, the floating support assembly 4 includes the daughter board 41, a connecting piece 42, and the elastic support piece 43 that are assembled together.

Specifically, the entire daughter board 41 has a rectangular flat-plate shape and is located below the electronic component 3, and the electronic component 3 is fastened to and installed on a pre-designed location of the daughter board 41 for installing the electronic component 3. An area of the daughter board 41 is less than an area of the circuit board 2, and therefore the daughter board 41 and the circuit board 2 completely overlap in the height direction T. In addition, the daughter board 41 has the daughter board connection end 41c that matches the circuit board connection end 2c of the circuit board 2. The daughter board connection end 41c can be inserted into the socket part of the circuit board connection end 2c, to implement signal communication between the daughter board connection end 41c and the circuit board connection end 2c. In this way, signal communication between the circuit board 2 and the electronic component 3 can be implemented through the daughter board 41, the daughter board connection end 41c, and the circuit board connection end 2c, and the signal communication implemented through the daughter board connection end 41c and the circuit board connection end 2c has features such as a large through-current capacity and a multi-signal transmission capability.

The connecting piece 42 is, for example, a bolt or a pin. The connecting piece 42 passes through a through hole formed by four corners of the daughter board 41, to extend to the circuit board 2 and connect to a corresponding part of the circuit board 2. In this way, in a state in which the daughter board 41 is connected to the circuit board 2 through the connecting piece 42, the daughter board 41 and the circuit board 2 can move relative to each other within a predetermined range in a direction (namely, the up-down direction in FIG. 3A) in which the pre-loading force is applied. Further, it may be understood that the daughter board connection end 41c and the circuit board connection end 2c can move relative to each other with a relative movement of the daughter board 41 and the circuit board 2. In this way, even if the daughter board connection end 41c and the circuit board connection end 2c move relative to each other, a connection relationship between the daughter board connection end 41c and the circuit board connection end 2c is not affected, so that signal quality and connection reliability are ensured.

The elastic support piece 43 may be, for example, a cylindrical coil spring and sleeved on a part that is of the connecting piece 42 and that is located between the daughter board 41 and the circuit board 2. One axial end of the cylindrical coil spring abuts against the daughter board 41, and the other end abuts against the circuit board 2. In this way, the elastic support piece 43 applies the pre-loading force to the daughter board 41 from a side (namely, a lower side in FIG. 3A) opposite to the side (namely, an upper side in FIG. 3A) that is of the daughter board 41 and on which the electronic component 3 is installed, to further apply the pre-loading force to the electronic component 3.

In a technical solution of the first embodiment, the floating support assembly 4 is disposed between the circuit board 2 and the electronic component 3. In this way, the electronic component 3 can abut against the top 111 of the upper housing 11 under an action of the pre-loading force of the floating support assembly 4, to ensure that heat generated by the electronic component 3 is transferred to the top 111 of the housing through a shortest heat transfer path when the electronic component 3 transfers the heat to the upper housing 11. Therefore, a thermal resistance is significantly reduced, and a heat dissipation capability of the electronic component 3 is effectively improved. In addition, a thermally conductive material layer between the electronic component 3 and the top 111 of the upper housing 11 is replaced, and the floating support assembly 4 can further support the daughter board 41 in a manner in which the daughter board 41 floats up and down relative to the circuit board 2 (in other words, relatively moves in the height direction T), to compensate for a dimension chain tolerance in the height direction T.

The following describes a specific structure of an electronic device having a floating support structure according to a second example embodiment of the present disclosure with reference to the accompanying drawings of this specification.

The structure of the electronic device having the floating support structure according to the second example embodiment of the present disclosure.

For ease of description, in this embodiment, details about a part that is the same as the structure in the first example embodiment shown in FIG. 3A and FIG. 3B are omitted. The following mainly describes a structure that is in this embodiment and that is different from that in the first embodiment.

Figure 4:
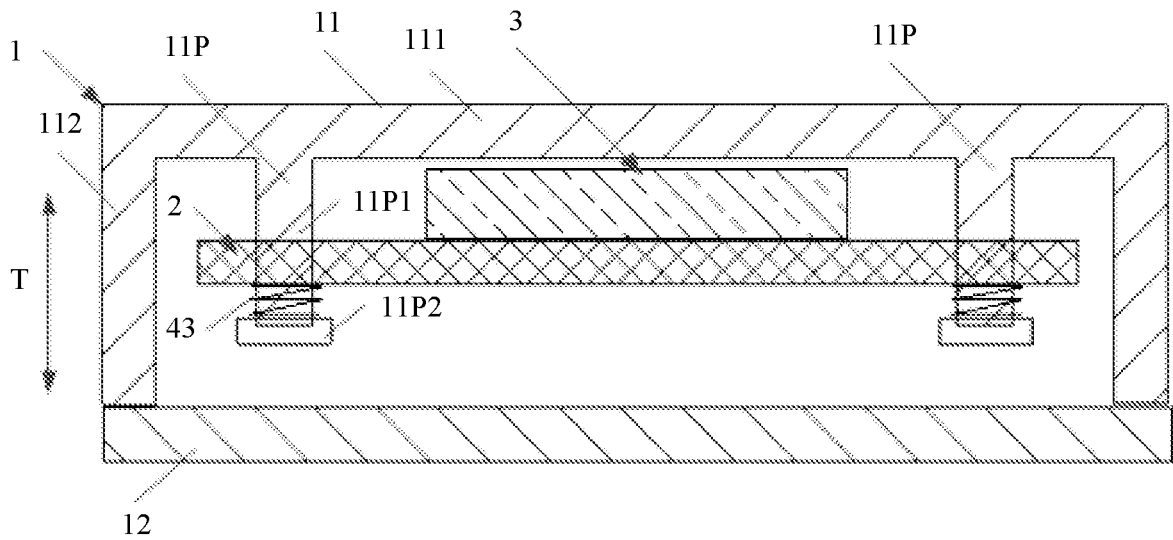
FIG. 4 is a schematic sectional view of an electronic device having a floating support structure according to a second example embodiment of the present disclosure.

In this embodiment, as shown in FIG. 4, the floating support assembly 4 is disposed on first protruding parts 11P of the upper housing 11, and the electronic component 3 is directly fastened to and installed on a corresponding part of the circuit board 2.

Further, the floating support assembly 4 includes a plurality of elastic support pieces 43 that are disposed on a lower end face of the circuit board 2 and that are sleeved on the first protruding parts 11P, and the elastic support pieces 43 may all be cylindrical coil springs. In FIG. 4, the electronic component 3 is located above the circuit board 2, and the plurality of elastic support pieces 43 are located below the circuit board 2. Therefore, the electronic component 3 and the plurality of elastic support pieces 43 are located on an opposite side of the circuit board 2. One end of each elastic support piece 43 abuts against the circuit board 2, and the other end abuts against the first protruding part 11P, so that each elastic support piece 43 is configured to apply a pre-loading force facing upward to the circuit board 2.

In cooperation with the structure in which the elastic support pieces 43 are disposed, the plurality of first protruding parts 11P of the upper housing 11 that protrude towards the circuit board 2 pass through the circuit board 2, and each elastic support piece 43 is sleeved on a part that is of the first protruding part 11P and that is located below the circuit board 2, so that the electronic component 3 disposed above the circuit board 2 abuts against the top 111 of the upper housing 11 under an action of the pre-loading force generated by the elastic support piece 43. More specifically, each first protruding part 11P includes a main body part 11P1 that is fastened to each other and that has a cylindrical shape and a flange part 11P2 that is located in the main body part 11P1 and that is away from a free end of the upper housing 11. The main body part 11P1 extends through the circuit board 2 from the upper part of the circuit board 2, the flange part 11P2 is disposed on a part that is of the main body part 11P1 and that is located below the circuit board 2, and an outer diameter of the flange part 11P2 is greater than an outer diameter of the main body part 11P1. In this way, one end of the elastic support piece 43 sleeved on the main body part 11P1 abuts against the circuit board 2, and the other end abuts against the flange part 11P2, so that the elastic support piece 43 can generate the expected pre-loading force.

Herein, the flange part 11P2 may be connected to the main body part 11P1 through various means. For example, the flange part 11P2 may be connected to the main body part 11P1 through a screw.

In a variation example of the second example embodiment, the entire first protruding part 11P may be located above the circuit board 2, and the circuit board 2 may be connected to the first protruding part 11P through a support piece or a connecting piece such as a screw. The support piece or the connecting piece such as a screw is connected to the first protruding part 11P through a corresponding hole in the circuit board 2. One end of an elastic piece such as a coil spring abuts against the circuit board 2, and the other end abuts against a lower end (namely, a flange) of the support piece or the connecting piece such as a screw.

The following describes a specific structure of an electronic device having a floating support structure according to a third example embodiment of the present disclosure with reference to the accompanying drawings of this specification.

The structure of the electronic device having the floating support structure according to the third example embodiment of the present disclosure.

For ease of description, in this embodiment, details about a part that is the same as the structure in the second example embodiment shown in FIG. 4 are omitted. The following mainly describes a structure that is in this embodiment and that is different from that in the second embodiment.

Figure 5:
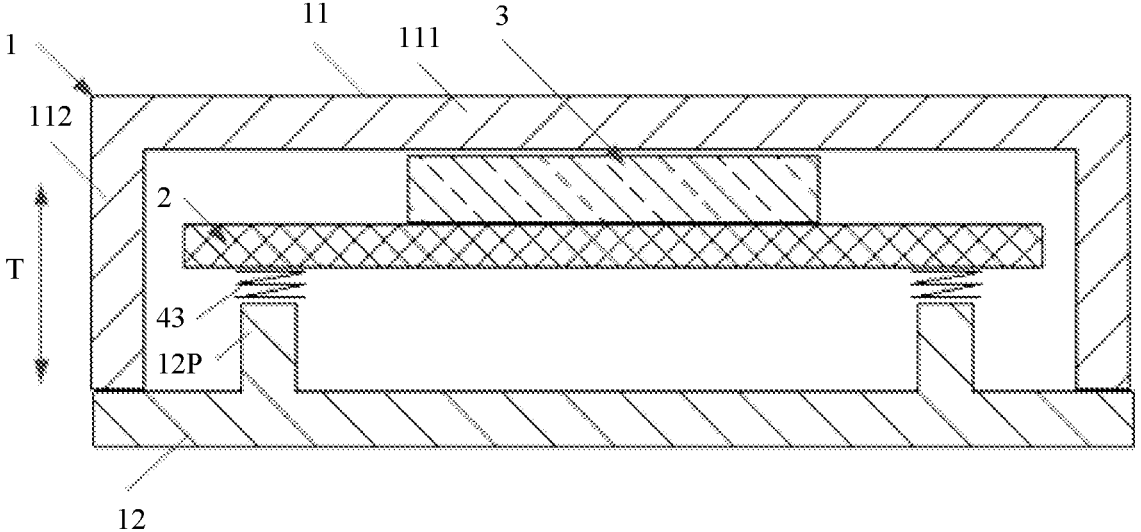
FIG. 5 is a schematic sectional view of an electronic device having a floating support structure according to a third example embodiment of the present disclosure.

In this embodiment, as shown in FIG. 5, the floating support assembly 4 is disposed on second protruding parts 12P of the bottom housing 12, and the electronic component 3 is directly fastened to and installed on a corresponding part of the circuit board 2.

Further, the floating support assembly 4 includes a plurality of elastic support pieces 43 disposed between a lower end face of the circuit board 2 and the second protruding parts 12P, and the elastic support pieces 43 may all be cylindrical coil springs. The electronic component 3 is located above the circuit board 2, and the plurality of elastic support pieces 43 are located below the circuit board 2. Therefore, the electronic component 3 and the plurality of elastic support pieces 43 are located on an opposite side of the circuit board 2. One end of each elastic support piece 43 abuts against the circuit board 2, and the other end abuts against the second protruding part 12P, so that each elastic support piece 43 is configured to apply a pre-loading force to the circuit board 2.

It may be understood that the circuit board 2 may be connected to the second protruding part 12P through a support piece or a connecting piece such as a screw, the circuit board 2 may move relative to the support piece or the connecting piece in the height direction T, and the elastic support piece 43 may be sleeved on the support piece or the connecting piece.

In this embodiment, the first protruding parts 11P of the upper housing 11 are omitted. Instead, the plurality of second protruding parts 12P protruding towards the circuit board 2 are formed on the upper housing 11, and each elastic support piece 43 is disposed on the second protruding part 12P, so that the elastic support piece 43 applies the pre-loading force to the circuit board 2.

The following describes a specific structure of an electronic device having a floating support structure according to a fourth example embodiment of the present disclosure with reference to the accompanying drawings of this specification.

(the Structure of the Electronic Device Having the Floating Support Structure According to the Fourth Example Embodiment of the Present Disclosure)

For ease of description, in this embodiment, details about a part that is the same as the structure in the second example embodiment shown in FIG. 4 are omitted. The following mainly describes a structure that is in this embodiment and that is different from that in the second embodiment.

Figure 6:
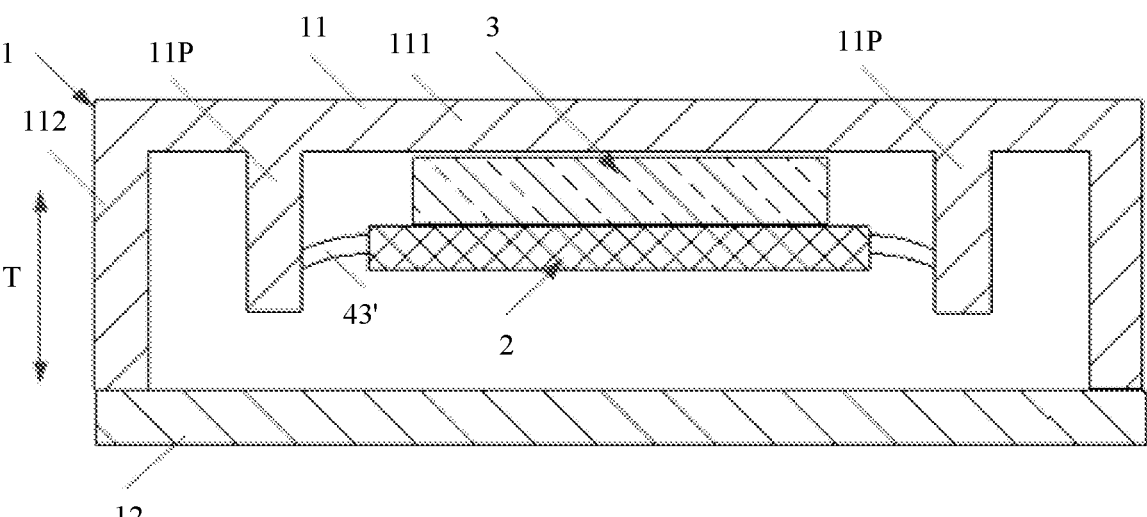
FIG. 6 is a schematic sectional view of an electronic device having a floating support structure according to a fourth example embodiment of the present disclosure.

In this embodiment, as shown in FIG. 6, the floating support assembly 4 is disposed on first protruding parts 11P of the upper housing 11, and the electronic component 3 is directly installed on a corresponding part of the circuit board 2. The floating support assembly 4 includes a plurality of elastic support pieces 43' disposed between an outer peripheral part of the circuit board 2 and the first protruding parts 11P of the upper housing 11, and the plurality of elastic support pieces 43' are configured to apply pre-loading forces to the circuit board 2. In this embodiment, the elastic support pieces 43' may be elastic sheets. The plurality of elastic sheets are arranged at intervals around the outer peripheral part of the circuit board 2, one end of each elastic sheet is connected to the outer peripheral part of the circuit board 2, and the other end is connected to the first protruding part 11P of the upper housing 11. In this way, the pre-loading force is applied to the circuit board 2 by using a structure of the elastic sheet.

Although the floating support assemblies 4 having different structures are described in the foregoing embodiments, it may be understood that the floating support assemblies 4 described in the second example embodiment to the fourth example embodiment can implement same effect as the floating support assembly 4 in the first example embodiment.

Figure 7:
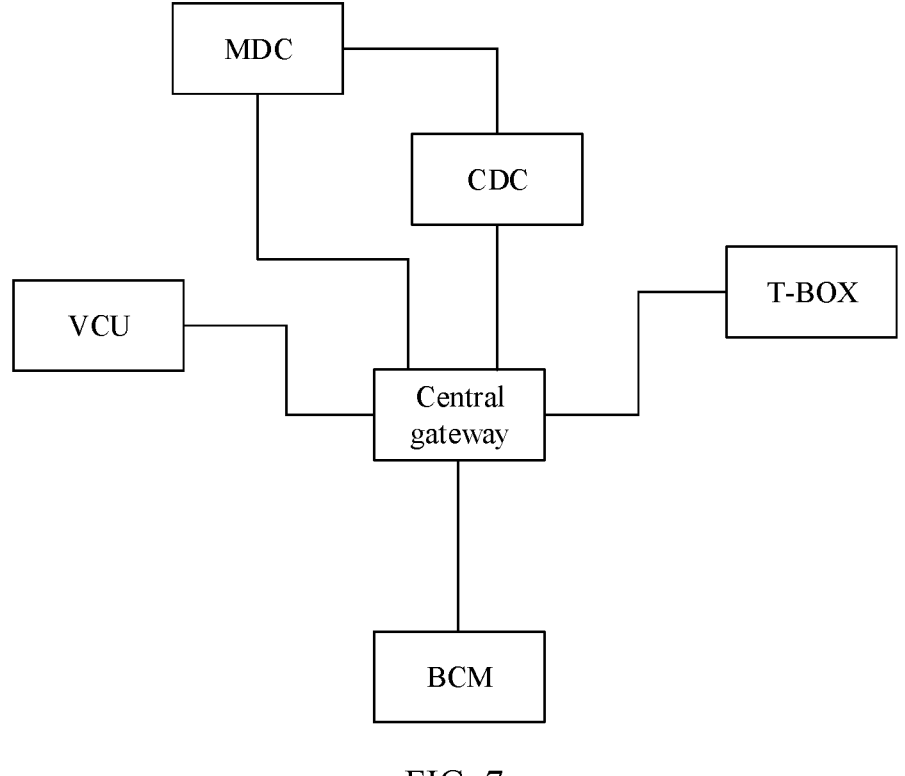
FIG. 7 is a schematic diagram of a connection structure of domain controllers of an intelligent vehicle, where the technical solutions in the present disclosure may be applied to support and heat dissipation of chips of the domain controllers.

The foregoing describes example embodiments of specific implementations of the present disclosure and a related variation example. The following provides supplementary description.

i. Although not clearly described in the foregoing specific implementations, it may be understood that, to improve a capability of the electronic component 3 to transfer heat to the top 111 of the upper housing 11, the electronic device may further include a thermally conductive material layer disposed between the upper housing 11 and the electronic component 3. The thermally conductive material layer may be a highly conductive thermal conductive interface material (TIM) such as silicone grease or a phase change film.

ii. Although it is described in the foregoing specific implementations that the circuit board 2 is a printed circuit board in the board form, the present disclosure is not limited thereto. The circuit board 2 may alternatively be a printed circuit board in a coupling board form.

iii. Although it is described in the foregoing specific implementations that the elastic support piece 43 or 43' is a spring or an elastic sheet, the present disclosure is not limited thereto. The elastic support piece may alternatively be a spring of another type or an elastic piece of another form.

iv. Although it is described in the foregoing specific implementations, for example, the first example embodiment and the fourth example embodiment, that the circuit board 2 is installed on the upper housing 11, it may be understood that, in the two example embodiments, the circuit board 2 may alternatively be installed on the bottom housing 12.

v. In addition, in an assembly process of the electronic device in the foregoing embodiments, preferably, the floating support assembly 4 can apply a sufficient pre-loading force towards the top 111 of the upper housing 11 to the electronic component 3, so that the electronic component 3 is closely attached to the top 111 of the upper housing 11, to meet a heat dissipation requirement and a pressure bearing capability requirement of the electronic component 3.

vi. It may be understood that the technical solutions in the present disclosure may be applied to various fields. FIG. 7 is a schematic diagram of a connection structure of domain controllers of an intelligent vehicle, where the technical solutions in the present disclosure may be applied to support and heat dissipation of chips of the domain controllers. Specifically, an electronic and electrical architecture of a vehicle continuously evolves from a conventional distributed architecture to a centralized domain controller architecture. The domain controller divides functions of each part of the vehicle electronics into several domains, such as a power drive domain, a vehicle body electronic domain, and an intelligent driving domain, and then uses a powerful core processor to control most functions that originally belong to electronic control units (ECUs) in the domains, to replace the conventional distributed architecture. FIG. 7 shows a typical architecture. The vehicle electronic architecture includes four domain controllers, a central gateway, and a telecommunication box (T-BOX). The four domain controllers include an intelligent driving domain controller (MDC), a vehicle body domain controller (BCM), a vehicle power domain controller (VCU), and an intelligent cockpit domain controller (CDC). The T-BOX is a remote information processor. Because the domain controller requires a powerful core processor, there is an extremely high requirement on a heat dissipation capability of a system, especially the core processor. In particular, as the intelligent driving domain controller, the MDC requires a powerful chip to provide powerful computing power. Therefore, the technical solutions in the present disclosure can be applied to vehicles such as an intelligent vehicle or a new energy vehicle. The technical solutions in the present disclosure may be used for support and heat dissipation of the chip of the MDC, and certainly may also be used for support and heat dissipation of chips of other domain controllers. In addition to the foregoing application examples, the technical solutions in the present disclosure may further be applied to various electronic components in the information technology (IT) and communication fields.

vii. It may be understood that, in the first example embodiment, compared with a communication solution implemented through a flexible circuit board, the communication solution implemented by connecting the daughter board connection end 41c and the circuit board connection end 2c to each other improves a communication capability and reduces costs. In addition, a disposition location of the electronic component 3 may be changed on the daughter board 41, so that the electronic component 3 may be disposed at any location on the daughter board 41, to effectively improve layout flexibility of the electronic component 3. Further, in all example embodiments of the present disclosure, because the floating support assembly 4 is not disposed above the electronic component 3, impact of a weight of the floating support assembly 4 on the electronic component 3 is avoided, and a stress problem in the electronic component 3 under the impact is avoided. In addition, in the present disclosure, a heat sink opening does not need to be disposed on the housing of the electronic device, so that the electronic device can meet requirements of various protection standards. In addition, the solutions in the present disclosure have a simple structure and low costs, and support various types of heat dissipation solutions such as air cooling and liquid cooling.

Although the present disclosure is described with reference to embodiments, in a process of implementing the present disclosure that claims protection, a person skilled in the art may understand and implement another variation of the disclosed embodiments by viewing the accompanying drawings, disclosed content, and the accompanying claims. In the claims, "comprising" does not exclude another component or another step, and "a" or "one" does not exclude a meaning of plurality. Some measures are recorded in dependent claims that are different from each other, but this does not mean that these measures cannot be combined to produce a better effect.

Embodiments of the present disclosure are described above. The foregoing descriptions are examples, are not exhaustive, and are not limited to the disclosed embodiments. Many modifications and changes are apparent to a person of ordinary skill in the art without departing from the scope of the described embodiments. Selection of terms used in this specification is intended to best explain the principles and actual application of embodiments or improvements to technologies in the market, or to enable another person of ordinary skill in the art to understand the embodiments disclosed in this specification.

What is claimed is:

1. An electronic device comprising:

a housing assembly comprising an installation space;

a circuit board fastened to and installed in the housing assembly and accommodated in the installation space;

an electronic component accommodated in the installation space and supported by the circuit board, wherein the electronic component is in signal communication with the circuit board; and a floating support assembly accommodated in the installation space, disposed on the circuit board to support the electronic component, and comprising:

a daughter board disposed between the circuit board and the electronic component, wherein the electronic component is fastened to and installed on the daughter board; and an elastic support piece disposed between the daughter board and the circuit board, wherein the elastic support piece applies a pre-loading force to the daughter board in a direction of the electronic component, wherein the electronic component abuts against the housing assembly under an action of the pre-loading force.

2. The electronic device of claim 1, wherein the floating support assembly further comprises a connecting piece passing through the daughter board and extending to the circuit board, wherein the connecting piece connects the daughter board to the circuit board, and wherein the daughter board and the circuit board move relative to each other within a predetermined range when connected by the connecting piece.

3. The electronic device of claim 2, wherein the elastic support piece is a coil spring sleeved on the connecting piece.

4. The electronic device of claim 3, wherein the daughter board comprises a daughter board connection end, and wherein the circuit board comprises a circuit board connection end coupled to the daughter board connection end to enable the signal communication.

5. The electronic device of claim 4, wherein the daughter board connection end and the circuit board connection end move relative to each other with a relative movement between the daughter board and the circuit board.

6. The electronic device of claim 1, wherein the circuit board has a circuit board area, the daughter board has a daughter board area, and the electronic component has an electronic component area,
   wherein the circuit board area is greater than the daughter board area, and
   wherein the daughter board area is greater than the electronic component area.

7. The electronic device of claim 1, wherein the signal communication has a multi-signal transmission capability.

8. An electronic device comprising:
   a housing assembly comprising an installation space;
   a circuit board accommodated in the installation space and installed in the housing assembly;
   an electronic component accommodated in the installation space and supported by the circuit board, wherein the electronic component is in signal communication with the circuit board; and
   a floating support assembly accommodated in the installation space,
   wherein the floating support assembly is disposed on the circuit board to support the electronic component and comprising:
      a daughter board disposed between the circuit board and the electronic component, wherein the electronic component is fastened to and installed on the daughter board; and
      a connecting piece passing through the daughter board and extending to the circuit board, wherein the connecting piece connects the daughter board to the circuit board, and wherein the daughter board and the circuit board move relative to each other within a predetermined range when connected by the connecting piece, and
   wherein the electronic component abuts against the housing assembly under an action of a pre-loading force of the floating support assembly.

9. The electronic device of claim 8, wherein the circuit board is fastened to and installed in the housing assembly, and wherein the floating support assembly comprises:
   an elastic support piece disposed between the daughter board and the circuit board, wherein the elastic support piece applies the pre-loading force to the daughter board in a direction of the electronic component.

10. The electronic device of claim 9, wherein the elastic support piece is a coil spring sleeved on the connecting piece.

11. The electronic device of claim 8, wherein the daughter board comprises a daughter board connection end, and wherein the circuit board comprises a circuit board connection end coupled to the daughter board connection end to enable the signal communication.

12. The electronic device of claim 11, wherein the daughter board connection end and the circuit board connection end move relative to each other with a relative movement between the daughter board and the circuit board.

13. The electronic device of claim 8, wherein the circuit board has a circuit board area, the daughter board has a daughter board area, and the electronic component has an electronic component area,
   wherein the circuit board area is greater than the daughter board area, and
   wherein the daughter board area is greater than the electronic component area.

14. The electronic device of claim 8, wherein the signal communication has a multi-signal transmission capability.

15. An electronic device comprising:
   a housing assembly comprising an installation space;
   a circuit board comprising a circuit board connection end, accommodated in the installation space, and installed in the housing assembly;
   an electronic component accommodated in the installation space and supported by the circuit board, wherein the electronic component is in signal communication with the circuit board; and
   a floating support assembly accommodated in the installation space,
   wherein the floating support assembly is disposed on the circuit board to support the electronic component and comprising a daughter board comprising a daughter board connection end coupled to the circuit board connection end to enable the signal communication, wherein the daughter board is disposed between the circuit board and the electronic component, and wherein the electronic component is fastened to and installed on the daughter board, and
   wherein the electronic component abuts against the housing assembly under an action of a pre-loading force of the floating support assembly.

16. The electronic device of claim 15, wherein the circuit board is fastened to and installed in the housing assembly, and wherein the floating support assembly comprises:
   an elastic support piece disposed between the daughter board and the circuit board, wherein the elastic support piece applies the pre-loading force to the daughter board in a direction of the electronic component.

17. The electronic device of claim 16, wherein the floating support assembly further comprises a connecting piece passing through the daughter board and extending to the circuit board, wherein the connecting piece connects the daughter board to the circuit board, and wherein the daughter board and the circuit board move relative to each other within a predetermined range when connected by the connecting piece.

18. The electronic device of claim 17, wherein the elastic support piece is a coil spring sleeved on the connecting piece.

19. The electronic device of claim 15, wherein the daughter board connection end and the circuit board connection end move relative to each other with a relative movement between the daughter board and the circuit board.

20. The electronic device of claim 15, wherein the circuit board has a circuit board area, the daughter board has a daughter board area, and the electronic component has an electronic component area,
   wherein the circuit board area is greater than the daughter board area, and
   wherein the daughter board area is greater than the electronic component area.

* * * * *